United States Patent [19]
Dennis

[11] Patent Number: 5,349,747
[45] Date of Patent: Sep. 27, 1994

[54] METHOD OF MAKING MODULE FOR AUTOMOTIVE ELECTRICAL SYSTEMS

[75] Inventor: Michael E. Dennis, Wiltshire, United Kingdom

[73] Assignee: I.S.T. Laboratories, Ltd., Westmead, United Kingdom

[21] Appl. No.: 996,571

[22] Filed: Dec. 24, 1992

Related U.S. Application Data

[62] Division of Ser. No. 508,285, Apr. 13, 1990, Pat. No. 5,198,696.

[30] Foreign Application Priority Data

Apr. 13, 1989 [GB] United Kingdom ............... 8908366

[51] Int. Cl.$^5$ ............................................. H05K 3/34
[52] U.S. Cl. ........................................ 29/840; 29/832; 307/10.1; 313/500
[58] Field of Search ............... 29/840, 825, 830, 832; 313/500; 307/10

[56] References Cited

U.S. PATENT DOCUMENTS

| 4,742,432 | 5/1988 | Thillays et al. | 313/500 X |
| 4,745,322 | 5/1988 | Terazaki | 313/500 X |
| 4,935,665 | 6/1990 | Murata | 313/500 |
| 5,167,556 | 12/1992 | Stein | 313/500 X |

FOREIGN PATENT DOCUMENTS 253244  1/1988  European Pat. Off. ............... 29/840

OTHER PUBLICATIONS

IBM Technical Disclosure Bulletin vol. 25 No. 2 Jul. 1982 pp. 653–655 by N. G. Aakalu et al.

Primary Examiner—Carl J. Arbes
Attorney, Agent, or Firm—Watson, Cole, Grindle & Watson

[57] ABSTRACT

An electrical system for an automobile comprises a plurality of slave modules connected to one or more respective loads and/or sensors, a power bus connecting the slave modules to a power supply and a signal bus connecting the slave modules to a control module operable to remotely control the switching of power supplied to the loads by the slave modules and/or the sampling of signals from the sensors wherein at least one of the slave modules and/or the control means comprises a thick film printed circuit formed on a metal substrate. The system simplifies the wiring loom of a vehicle and provides circuits which are resistant to vibration and electrical interference.

5 Claims, 7 Drawing Sheets

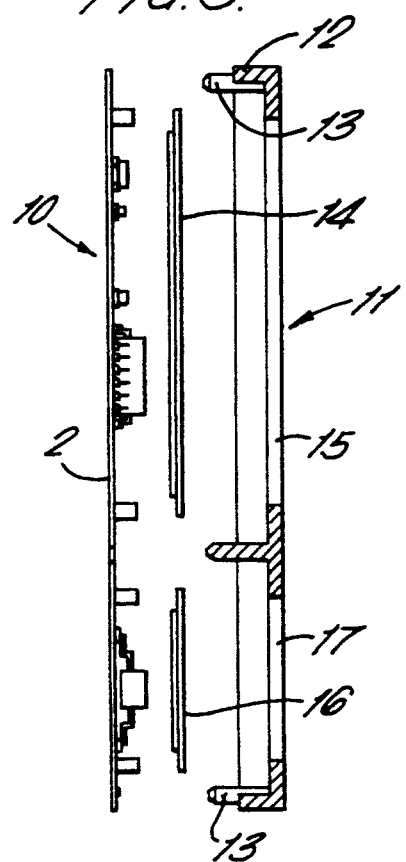
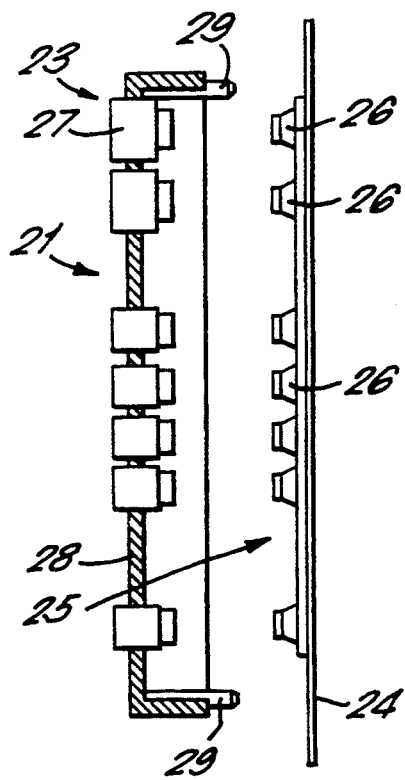
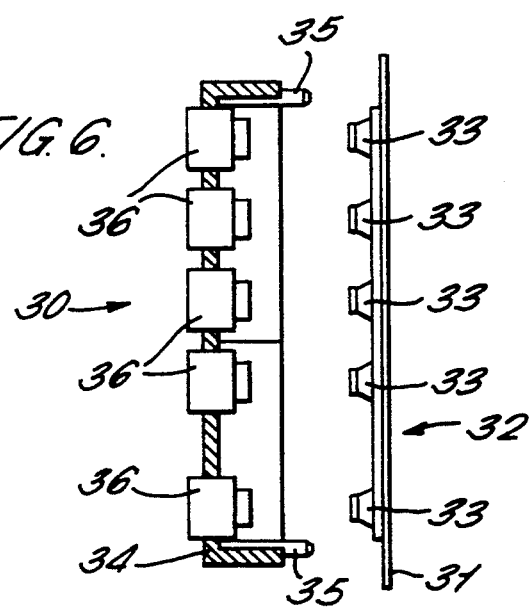

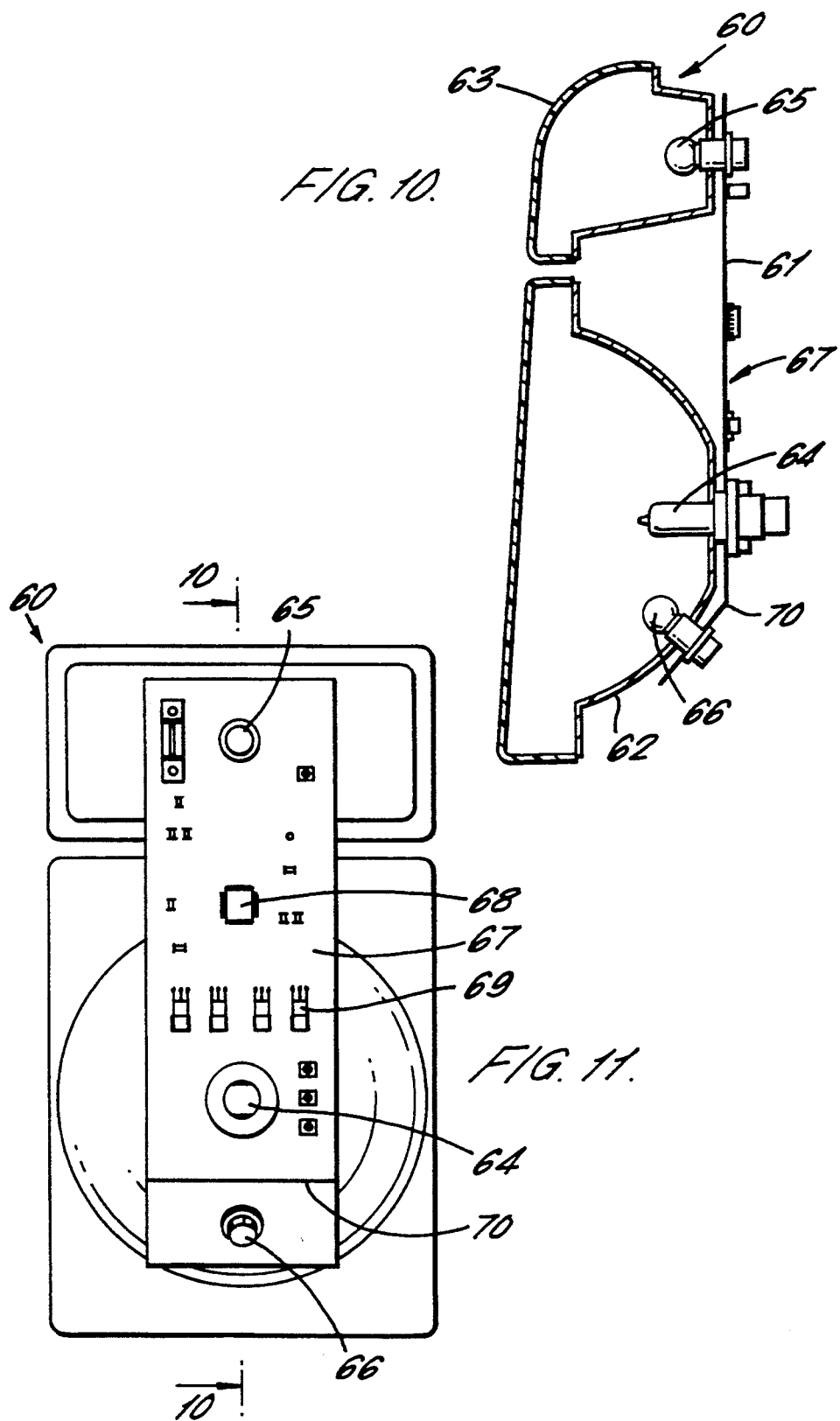

METHOD OF MAKING MODULE FOR AUTOMOTIVE ELECTRICAL SYSTEMS

This application is a divisional application of application Ser. No. 508,285, filed 13 Apr. 1990, now U.S. Pat. No. 5,198,696.

This invention relates to automotive electrical systems and in particular but not exclusively to systems including a multiplexed telemetry system enabling current switching devices to be remotely controlled from a centralised control unit.

It has been proposed in GB-1589444 for example to simplify the wiring loom of an automobile by arranging for the current switching of the electrical loads of devices such as lights, windscreen wiper motors etc to be effected by current switching circuits each located at or near to one or more devices to be switched and for the current switching circuit to be remotely controlled. It has also been proposed to use multiplexed telemetry systems to remotely control such circuits from a control unit so that the circuits typically need to incorporate semiconductor devices for both signal processing and current switching.

A problem with such systems is that circuit components are required to withstand severe vibrational, humidity and temperature conditions whilst maintaining high reliability at low cost. The adoption within the automotive industry of such systems in mass produced vehicles has hitherto not been practicable for these reasons.

According to the present invention there is disclosed an electrical system for an automobile comprising a plurality of slave modules connected to one or more respective loads and/or sensors, a power bus connecting the slave modules to a power supply and a signal bus connecting the slave modules to a control module operable to remotely control the switching of power supplied to the loads by the slave modules and/or the sampling of signals from the sensors wherein at least one of the slave modules and/or the control means comprises a thick film printed circuit formed on a metal substrate.

The use of a metal substrate provides superior vibration tolerance compared with conventional printed circuit boards formed from non-metallic materials. It has also been found that the metal substrate provides good electrical screening to the circuit both to isolate the circuit from the high tension electrics of the vehicle and to prevent electrical interference generated by the circuit from affecting other circuitry such as communications equipment.

A further advantage is that the metal substrate provides good heat conduction which is important in such low voltage applications where typically 12 volt 100 volt-amp loads are used. By bolting the substrate to the vehicle structure an effectively infinite heat sink can be generated.

Preferably the substrate is formed of stainless steel. A suitable grade is BS430 standard stainless steel having a chromium content of 15%. In preparing the thick film circuit such a steel substrate is subjected to a heat treatment in which the substrate is passed through a multi-chamber temperature profiled oven at 800° C. to 1000° C. Migration of chromium takes place during this process in which oxidation forms a chromium oxide surface layer. Dielectric layers are then applied to one or more selected areas of the substrate, an initial adhesion layer being selected for high adhesion properties and having a coefficient of thermal expansion approximately equal to that of the steel. One or more subsequent layers of graded coefficient are then applied such that a final layer has a coefficient matched to conventional thick film ink. Conductors, resistors and capacitors may then be applied by conventional screen printing processes as required and surface mounted components such as transistors and integrated circuits may then be soldered to conductors of the thick film circuit to provide a hybrid circuit.

18 gauge steel sheet (1.2 mm in thickness) has been found suitable in such substrates.

Conveniently the steel plate may form a structural element of a component of the automobile. The installation of circuits to the vehicle is thereby simplified by reducing the number of components and there are consequent cost savings in materials and assembly.

The structural element may be a housing of the slave module, a housing of the control module, a housing of a keyboard connected to the control module for the input of commands or the structural element may be a component of an electrical device defining a load which is switched by the circuit formed on the substrate. A headlight cluster of an automobile may include a slave module having a circuit with a substrate comprising a structural element of the headlight cluster. Other electrical devices may similarly be integrally formed with such substrates.

Preferably the control module, the slave modules and the signal bus together comprise a multiplexed telemetry system. The advantages of such systems are that the automobile wiring loom is greatly simplified since it is no longer necessary to run power carrying wires to the control switches located at the driver position (generally on the dashboard). In such a multiplexed telemetry system the signal bus and power bus require only a signal bus and a single power cable to be connected to the control module located at the driver position. A keyboard and other switches may then be connected to the control module for the input of commands which are transmitted to the slave modules via the signal bus to control power switching carried out by the slave modules.

The circuits having steel substrates may be encapsulated in suitable moistureproof coatings to thereby render the circuits impervious to the high humidity conditions encountered in automobile components.

Conveniently the signal bus may comprise two conducting wires connected in parallel between the modules. Digital signals may be applied in antiphase to the conducting wires to minimise electrical interference effects.

Specific embodiments of the present invention will now be described by reference to the accompanying drawings of which:

FIG. 3 is an exploded side elevation of a display unit sectioned at III;

FIG. 5 is an exploded side elevation sectioned at V of the display unit of FIG. 4;

FIG. 6 is an exploded side elevation of a keyboard;

FIG. 10 is a sectional side view of a headlamp assembly;

FIG. 11 is a rear view of the assembly of FIG. 10;

Figure 1:
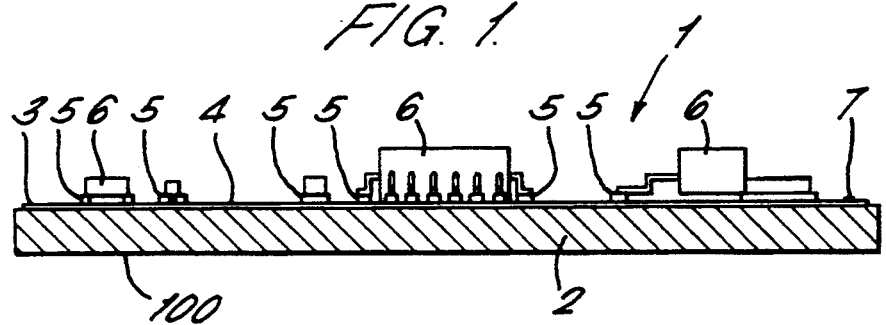
FIG. 1 is a sectional side elevation of a thick film circuit having a metal substrate.

FIG. 1 shows a thick film circuit 1 in which a stainless steel sheet 2 constitutes a metal substrate of the circuit. A composite dielectric layer 3 is deposited only on an upper surface 4 of the sheet 2, the dielectric layer being applied in a number of separate coatings. The sheet 2 has a lower surface 100 which remains uncoated.

The steel sheet 2 is initially fired in an oven to form a chromium oxide surface layer, the firing process being carried out at a temperature of 850° C. to 900° C. A first dielectric adhesion layer is then adhered to the oxidised steel sheet 2, the adhesion layer being selected to have a coefficient of thermal expansion approximately equal to that of the steel. One or more further separate coatings are then separately applied such that the final coating has a coefficient of thermal expansion approximately equal to a thick film ink. Any intermediate buffer coatings are arranged to provide a gradient of intermediate coefficients of thermal expansion.

A thick film circuit layout is then applied by silk screen printing in which a first conductor layer, a crossover dielectric layer and a second conductor layer are printed. Solder pads 5 in the form of solder paste are applied to the exposed conductor layer and surface mounted components 6 are soldered to the solder pads 5 so as to be electrically and mechanically connected as part of the circuit 1.

Figure 2:
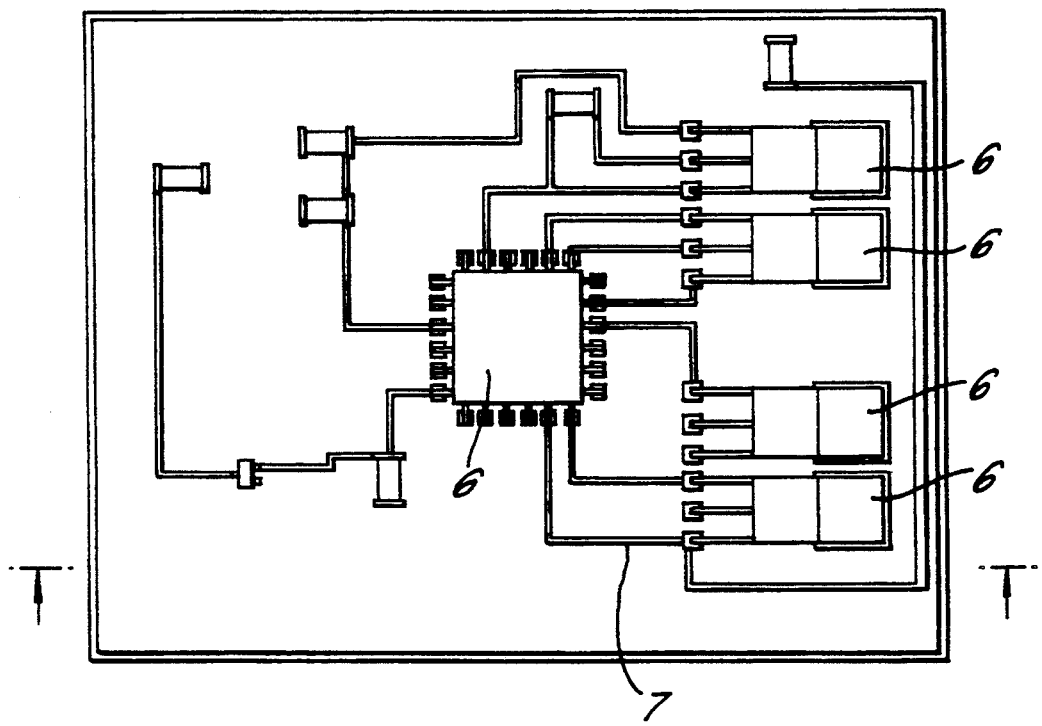
FIG. 2 is a plan view of the circuit of FIG. 1.

Thick film conductor tracks 7 printed in the form of silver polymer applied to the dielectric layer provide interconnection between the pads as shown in FIG. 2. An encapsulating layer is finally applied to complete the composite layer.

The steel sheet 2 is formed of grade BS430 stainless steel which is resistant to corrosion so that painting or other surface protection is not required for those surface portions not covered by the composite layer 3. The circuit 1 of FIGS. 1 and 2 provides switching of electrical power to a cluster of electrical loads (not shown) located adjacent to the location at which the circuit is mounted on the vehicle and is controlled by multiplexed telemetry signals decoded by means of an integrated circuit which comprises one of the surface mounted components of the circuit.

The steel sheet 2 is bolted directly to a body panel of the vehicle so as to be securely mechanically mounted with the uncoated lower surface 100 of the sheet in contact with the body panel. This also provides for the dissipation of heat generated in the circuit by conduction to the vehicle body which thereby serves as a heat sink.

In FIG. 3 a further thick film circuit 10 of similar construction to that of the circuit 1 of FIG. 1 forms part of a display unit 11 which in use is mounted in the dashboard of a vehicle.

Corresponding reference numerals are used in FIG. 3 to those of FIG. 1 where this is appropriate. The circuit 10 of the display unit 11 has a stainless steel sheet 2 which serves as a substrate for the thick film circuit and also constitutes a rear panel of the display unit. An apertured front panel 12 of the display unit 11 is connected to the sheet 2 by means of retaining pegs 13. An upper liquid crystal display panel 14 is mounted behind an upper aperture 15 formed in the front panel 12 and a lower liquid crystal display panel 16 is similarly located behind a lower aperture 17 in the front panel 12.

Figure 4:
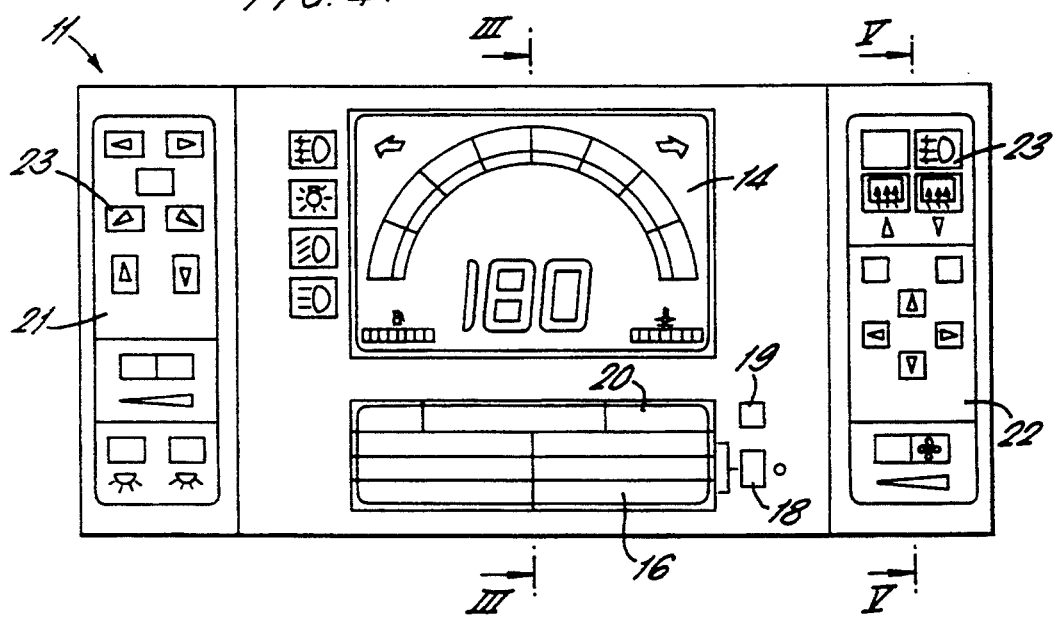
FIG. 4 is a front elevation of the display unit of FIG. 3.

As shown in FIG. 4 the upper liquid crystal display 14 displays vehicle speed, engine speed, fuel guage and engine temperature readings. The lower liquid crystal display panel 16 displays other numerical information and warnings including battery voltage, oil pressure, fuel level warning, odometer reading and other parameters selectable by operation of a status scroll key 18. An odometer reset button 19 is provided for resetting a trip mileage indicator 20.

The display unit 11 includes left and right hand key pads 21 and 22 respectively incorporating push button switches 23 for operating windows, mirrors, lights and ventilation fan.

In FIG. 5 a display unit key pad 21 is shown in exploded side view and includes a stainless steel sheet 24 which constitutes a substrate for a thick film circuit on one side of the sheet and on which a key pad circuit 25 is formed. The sheet 24 also serves as a rear panel of the keypad. The keypad circuit 25 includes switch elements 26 forming part of the switches 23 and which are actuated by depression of actuators 27 mounted on a cover moulding 28. Locating pegs 29 secure the cover moulding 28 to the steel sheet 24.

In FIG. 6 a keyboard 30 comprises a stainless steel sheet 31 consitituting the substrate of a thick film hybrid circuit 32 formed on one side of the sheet and whose components include switch elements 33. A cover 34 is connectable to the sheet 31 by means of locating pegs 35. Switch elements 33 are operated by movement of actuators 36 mounted in the cover 34. The sheet 31 also constitutes the rear panel of the keyboard.

Figure 7:
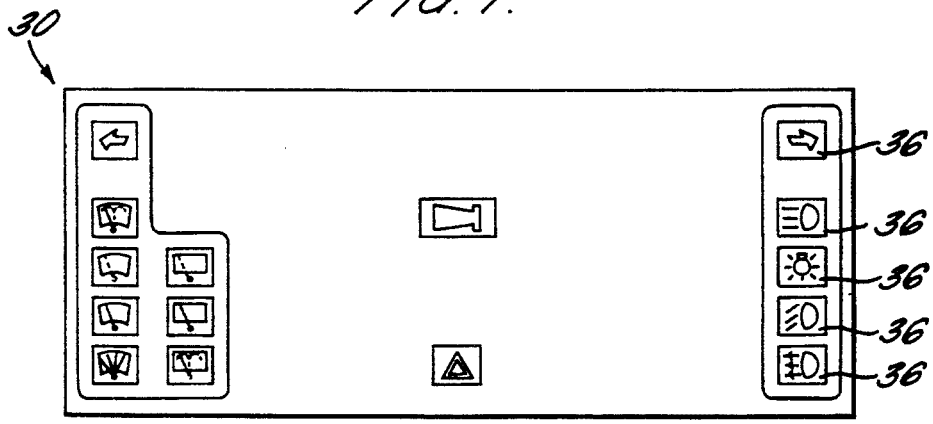
FIG. 7 is a front view of the keyboard of FIG. 6.

As seen in FIG. 7 the layout of the keyboard 30 is similar to that of a conventional vehicle dashboard in that it provides an array of switch actuators 36 each marked to indicate the function of the corresponding switch element 33 and providing switching of hazard warning lights, windscreen wipers and the like.

Figure 8:
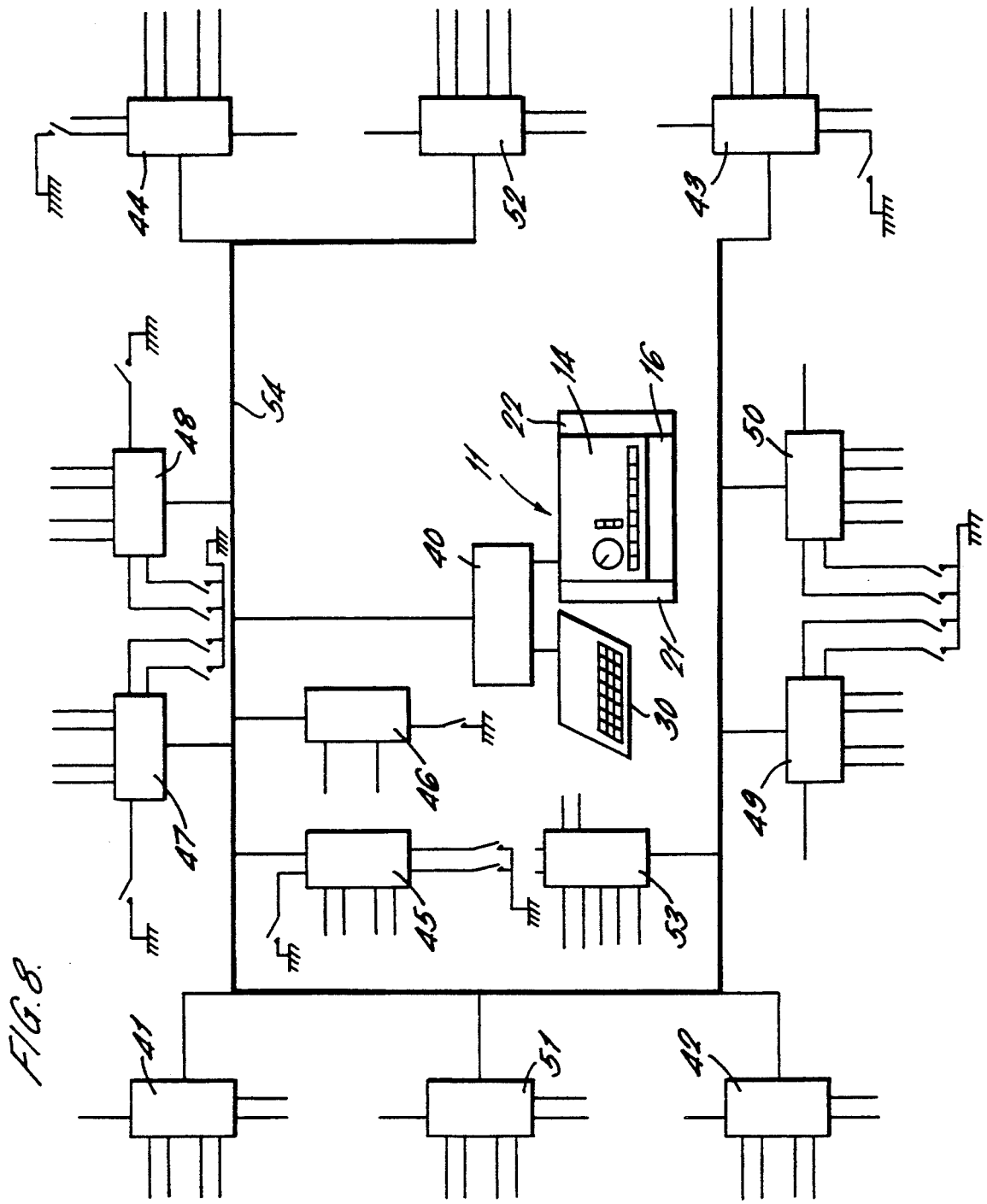
FIG. 8 is a schematic plan of the signal bus connections of an electrical system having multiplexed telemetry.

FIG. 8 is a schematic plan of the electrical system of a vehicle in which the display panels 14 and 16 are connected to a control module 40 as is the keyboard 30. The control module 40 is constituted by the circuit 10 of FIG. 3 which is incorporated in the display unit 11 together with the display panels 14 and 16.

Figure 9:
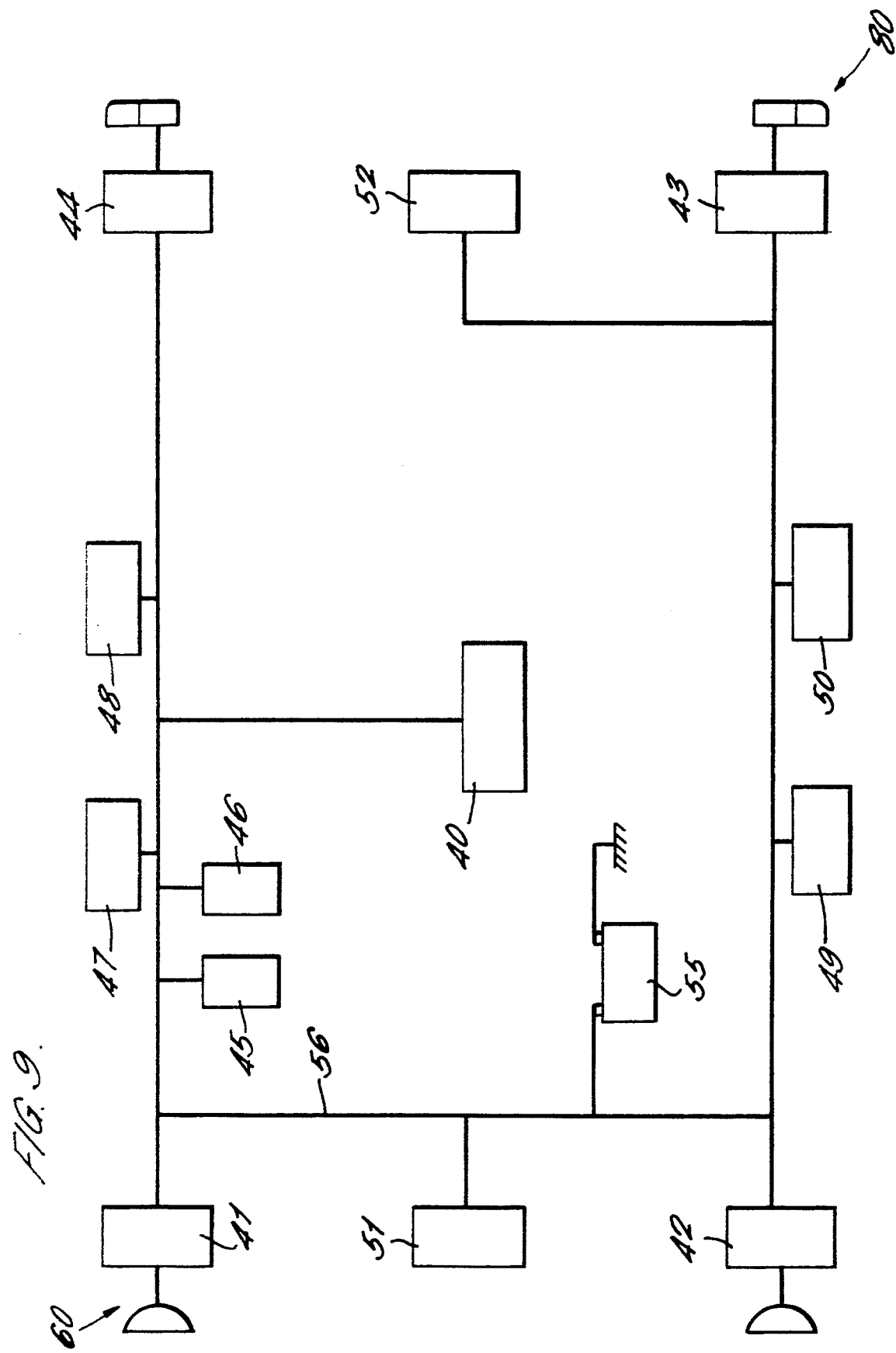
FIG. 9 is a schematic plan of the power bus connections of the system of FIG. 8.

The control module 40 is connected to slave modules 41 to 53 by a signal bus 54. The control module 40 and the slave modules 41 to 53 are also connected to a battery/alternator driven direct current power supply 55 by means of a power bus 56 as shown in FIG. 9.

Slave module 41 is located at the right-hand front wing of the vehicle and supplies current to a cluster of light fittings in that locality including a trafficator, side light, dipped beam and main beam light bulbs. Power supplied to the slave module 41 from the power bus 56 is switched by the slave module to the required light bulbs in accordance with instructions received by the slave module 41 from the control module 40 via the signal bus 54. Slave modules 42, 43 and 44 similarly control and distribute power to light clusters on the remaining wings of the vehicle. Slave module 45 is responsible for switching power from the power bus 56 to the wiper motor, windscreen washer, and electrically powered aerial motor of the vehicle in response to signals received from the control module 40 via the signal bus 54. The slave module 45 is also responsible for transmitting to the control module 40 via the signal bus 54 signals indicating the status of the brake fluid level and windscreen washer reservoir level.

The slave module 46 is arranged to switch electrical power from the power bus 56 to the vehicle ventilation blower motor, interior lights and other accessories in response to signals received from the control module via the signal bus 54.

Slave modules 47, 48, 49 and 50 are located in the vehicle door panels and are responsible for switching power from the power bus 56 to the window and mirror control motors in response to signals received via the signal bus 54. These modules 47 to 50 are also responsible for sending to the control module via the signal bus 54 signals indicating the status of the door open/closed sensors.

Auxiliary slave modules 51 and 52 are located at the front and rear of the vehicle respectively and are responsible for switching current to the remaining vehicle accessories such as the horn, spotlights, tailgate wiper motor and washer pump etc., in response to signals received from the control module 40 via the signal bus 54.

Signals transmitted to the control module 40 are displayed by means of the display unit 11 on the liquid crystal display panels 14 and 16. Control signals are generated by the control module 40 in response to input received by the keyboard 30 and also the display unit keypads 21 and 22 associated with display unit 11. The switch element 33 of the keyboard 30 and other switches of the left and right keypads 21 and 22 need only be light-duty switches suitable for switching currents of less than 5 milliamps since the switches do not directly switch the power supplied to their respective electrical loads, the act of power switching being carried out by an associated slave module.

Slave module 53 does not carry out any current switching operation in the sense of supplying power to vehicle utilities. It is dedicated to the acquisition of data from the engine compartment where it is located as to the status of the engine water temperature, oil pressure, alternator output, engine speed, road speed, gear selection and oil temperature. This data is input to slave module 53 from the various sensors and subsequently transmitted to the control module 40 via the signal bus 54.

The control module 40 sends and receives signals to and from the slave modules by means of serially encoded binary digital signals. The slave modules 41 to 53 are sequentially polled using sixteen bit messages so that the signals are thereby time-multiplexed. The first four bits of each message comprise an address code uniquely identifying a particular slave module. The subsequent three bits identify the device within the specified module and the following bit consists of a parity check bit. The remaining bits are then available for the sending and receiving of instructions.

Where necessary, as in the case for example of the engine compartment slave module 53, more than one sixteen bit message may be required to accommodate the transmission of data from engine sensors to the control module.

The polling cycle is twentyfive times per second with a frame synchronisation message consisting of a 0-1 sequence repeated eight times.

The signal bus 54 consists of two conducting wires connected in parallel between the control and slave modules 40 to 53. Digital signals are applied in antiphase to the respective wires such that a 0 is respresented by a voltage equal to one half of battery voltage and a 1 is represented by plus and minus voltages applied to the respective wires relative to the reference voltage. Radio emission from this signal bus is thereby minimised.

The wiring loom of the vehicle is thereby greatly simplified compared with conventional looms in that the minimum number of wires extending into the passenger area consists of the two wires constituting the signal bus and a connection to the power bus 56 to supply power for the control module, display unit and keyboard.

The power bus 56 consists of a heavy duty power cable capable of carrying the full current available from the power supply 55. The return conduction path from each electrical load to the power supply 55 is via the vehicle body as in the case of conventional vehicle wiring.

FIGS. 10 and 11 show a headlight assembly 60 suitable for incorporation in the front offside vehicle wing. The headlight assembly 60 comprises a stainless steel plate 61 to which are connected a headlamp 62 and an indicator lamp 63 having headlamp and indicator bulbs 64 and 65 respectively. The headlamp 62 also includes a sidelight bulb 66.

The steel plate 61 constitutes a chassis on which the headlamp 62 and indicator 64 are supported. The steel plate 61 also comprises the substrate of a thick film circuit 67 formed on one side of the sheet and including an integrated circuit 68 forming part of the multiplexed telemetry system of the vehicle and MOS FET devices 69 for switching current to the bulbs 64, 65 and 66. The circuit 67 thereby constitutes slave module 41 shown schematically in FIG. 9 and responding to telemetered signals received from the control module 40.

The steel plate 61 which carries the thick film circuit is bent through 45° at bend line 70 so as to present the sidelight bulb 60 at its correct position in the headlamp 62. This bending operation is carried out after the forming of the thick film circuit. It has been found that the dielectric film applied to the steel plate 61 can withstand such bending operations without damage provided the bend radius is maintained within reasonable limits.

In preparing the steel plate 61 for use in the headlamp assembly 60 holes are formed in the steel plate to accommodate the bulbs 64, 65 and 66 which have bases projecting through the plate.

Figure 12:
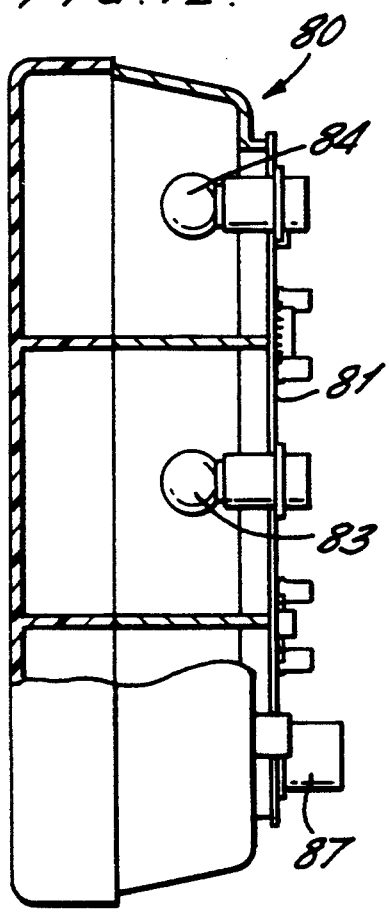
FIG. 12 is a sectioned side view of a taillamp assembly.
Figure 13:
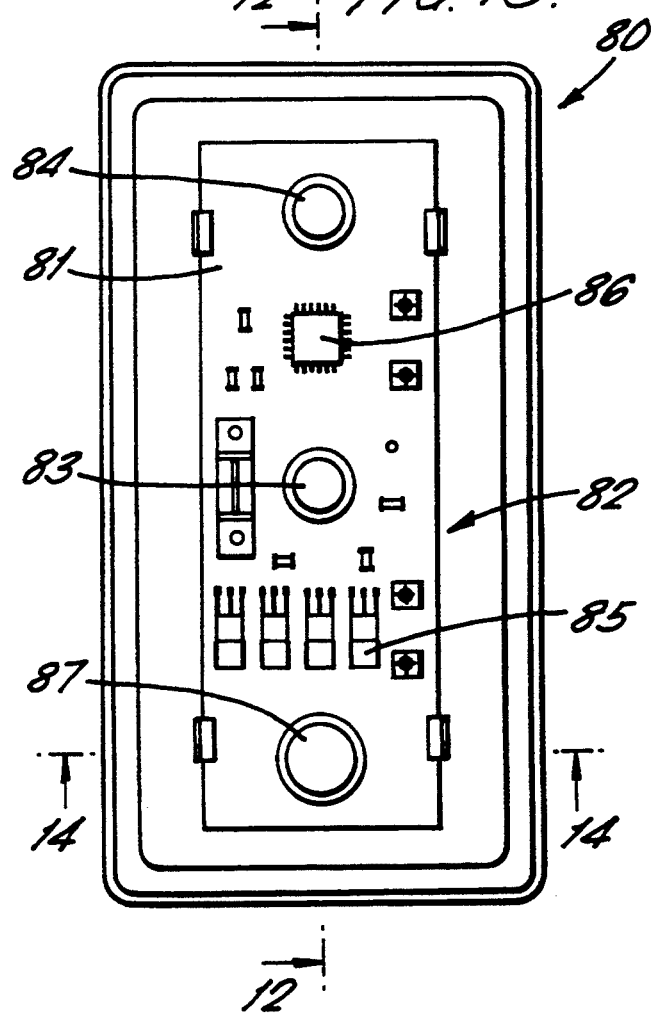
FIG. 13 is a gear view of the assembly of FIG. 12.
Figure 14:
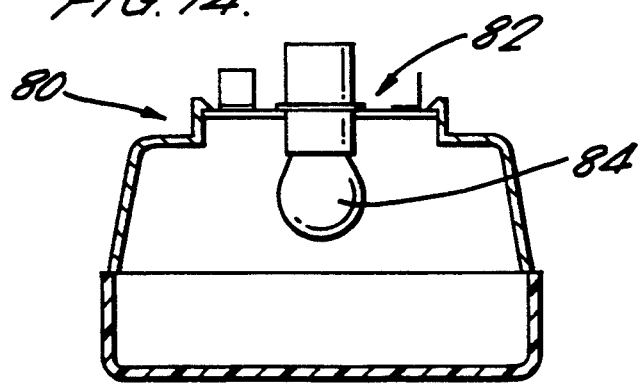
FIG. 14 is a sectioned plan view of an assembly of FIGS. 12 and 13.

FIGS. 12, 13 and 14 show a taillight assembly 80 comprising a stainless steel plate 81 on which is formed a thick film circuit 82. Bulbs 83, 84 and 87 are mounted on the steel plate 81 and extend through holes drilled in the plate. The bulbs are connected in the circuit 82 so that power to the bulbs is switched by means of MOS FETs 85 in response to signals from the control module 40 which are decoded by means of integrated circuit 86. The MOS FETs 85 and integrated circuit 86 are both surface mounted on the thick film circuit 82. The circuit 82 thereby comprises slave module 43 of the circuit shown in FIG. 9 which shows the taillight assembly 80 in schematic form.

The steel plate 81 constitutes a chassis to which the components on the taillight assembly 80 are connected mechanically and also includes electrical connections between the bulbs 83, 84 and 87 and the circuit 82.

Both the headlight assembly 60 and the taillight assembly 80 are bolted to the vehicle such that in each case the steel plates 61 and 81 respectively make contact with steel members providing both mechanical support and acting as heat sinks for the circuits 68 and 82 respectively. Electrical contact between the steel plate and the vehicle body may also serve as a return electrical path of the power circuit or alternatively the conduction path may be via the connecting bolt or screws extending through the plate into the vehicle body.

Electrical devices other than headlamp and taillight assemblies may similarly be constructed using a metal plate which serves both as a substrate for a thick film circuit of a slave module and as a structural element of the device which may for example be a wiper motor, or washer pump motor.

Other forms of multiplexed telemetry system may be used such as frequency modulated systems. The data bus may be a coaxial cable or fibre optic link. The two conducting wire system described in the preferred embodiment may be modified to comprise a single conducting wire with the return path being constituted by the vehicle body.

The extent to which the components of the circuit are surface mounted can be varied so that resistors and capacitors for example may be either integrally formed in the printing process or may be discrete components which are surface mounted to conductive pads. It is envisaged that prototype systems will tend to include more discrete surface mounted components whereas in the production phase the number of surface mounted components will be reduced to a minimum.

The steel sheet substrate may be bent into any convenient shape provided the bend radius is sufficient to avoid damage to the thick film circuit so that more complex shapes may be used than are shown in the preferred embodiments.

I claim:

1. A method of forming a module of an electrical system for an automobile, comprising the steps of:
    subjecting to heat treatment a substrate formed from stainless steel sheet, the heat treatment being such as to heat the substrate to a temperature in the range 800 degrees C. to 1000 degrees C., whereby a chromium oxide layer is formed on the substrate;
    applying an initial adhesion layer of a dielectric material to a surface portion of the substrate such that an uncoated surface portion remains exposed, the dielectric material being selected to have a coefficient of thermal expansion substantially equal that of stainless steel;
    subsequently applying a final layer of a further dielectric material selected to have a coefficient of thermal expansion substantially matched to that of a thick film ink;
    applying electrical components including conductors by a screen printing process in which thick film inks are printed onto the final layer to thereby form a thick film circuit; and
    surface mounting further electrical components by soldering to conductors of the thick film circuit.

2. A method as claimed in claim 1, further comprising the step of mounting the module in the vehicle such that an uncoated surface portion of the substrate is in contact with a body panel of the vehicle.

3. A method as claimed in claim 2, further comprising a step of bending the substrate into a desired shape such that the substrate constitutes a structural element of the vehicle.

4. A method as claimed in claim 2, further comprising the step of encapsulating the thick film circuit in a moisture-proof coating.

5. A method as claimed in claim 1, including the step of applying at least one additional layer of dielectric material to the initial adhesion layer before the addition of the final layer, the respective dielectric material of the at least one additional layer being selected such that the coefficients of thermal expansion of the dielectric layers are progressively graded.

* * * * *